United States Patent [19]

Mencik et al.

[11] Patent Number: 5,163,605
[45] Date of Patent: Nov. 17, 1992

[54] METHOD FOR MOUNTING COMPONENTS TO A CIRCUIT BOARD

[75] Inventors: Michael J. Mencik, Lauderhill; Richard P. Lambert, Jr., Deerfield Beach; Helmut Matheis, Coral Springs; Donald K. Swenson, Sunrise, all of Fla.

[73] Assignee: Allied-Signal Inc., Morris Township, Morris County, N.J.

[21] Appl. No.: 876,347

[22] Filed: Apr. 30, 1992

[51] Int. Cl.⁵ .............................................. A05K 3/34
[52] U.S. Cl. .................................. 228/180.2; 228/189; 228/212; 228/118
[58] Field of Search ................. 228/180.2, 189, 212, 228/214, 215, 118, 179

[56] References Cited

U.S. PATENT DOCUMENTS 5,001,829  3/1991  Schelhorn .................... 228/180.2
5,012,969  5/1991  Hatada et al. ................ 228/180.2
5,060,844 10/1991  Behun et al. ................. 228/215

Primary Examiner—Samuel M. Heinrich
Attorney, Agent, or Firm—Howard G. Masssung; Robert A. Walsh

[57] ABSTRACT

A component is mounted to a circuit board by covering a section of the board's conductive pads with a nonconductive mask. It is also possible to plate additional conductive material onto the pads before applying the mask. The component's contacts are soldered to the uncovered sections of the pads or plating.

16 Claims, 4 Drawing Sheets

METHOD FOR MOUNTING COMPONENTS TO A CIRCUIT BOARD

Background of the Invention

1. Field of the Invention

The present invention relates to circuit boards, more specifically it relates to mounting components on a circuit board.

2. Description of the Related Art

Typically, the surface of a circuit board contains conductive paths and conductive pads. The conductive pads are used to connect a component to a conductive path which may be on an outer or inner surface of the circuit board. The outer surface of the circuit board is protected by a mask of nonconductive material. This mask usually covers the entire top surface of the circuit board except for the pads. The pads are left uncovered to permit soldering components to the pads.

FIG. 1 illustrates component 10, with conductive contacts 12 and 14, mounted to circuit board 16. Contact 12 is connected to pad 18 by solder 22 and contact 14 is connected to pad 20 by solder 24. Upper surface 26 of circuit board 16 is protected by mask 28. Mask 28 covers all of surface 26 except for the areas including and surrounding pads 18 and 20. Pads 18 and 20 are left uncovered so that electrical contact can be made with the conductive contacts of component 10.

FIG. 2 is a top view of circuit board 16 illustrating the areas not covered by mask 28. Areas 36 and 38 are the portions of upper surface 26 that are not covered by mask 28. Area 36 leaves pad 18 and a small portion of top surface 26 uncovered. Area 38 leaves pad 20 and a small portion of surface 26 uncovered.

Referring to FIG. 1, this component mounting technique results in space 44, which is the space between the top surface of mask 28 and the bottom surface of component 10, being rather small. A typical height for space 44 is approximately 0.002 inches.

During the manufacturing process, it is typical for solder flux and other residue to become trapped in space 44. In the past, this debris was removed by cleaning the assembled circuit board using CFCs. It has been learned that CFCs damage the earth's ozone layer, and therefore it is no longer desirable to use such a substance to remove the debris from space 44.

Water is one of the more desirable substitutes for a CFC cleaning solution. Unfortunately, water does not remove debris from space 44 as throughly as CFCs. Therefore, it is desirable to mount components to a circuit board in a fashion that allows thorough cleaning using water.

SUMMARY OF THE INVENTION

The present invention provides a method for mounting components having conductive contacts to a circuit board having conductive pads. A section of the conductive pad is covered with a nonconductive material, and the component's conductive contact is soldered to the conductive pad so that the nonconductive material is positioned between the component's conductive contact and the covered section of the conductive pad.

The present invention increases the space beneath the component and thereby facilitates removing debris from beneath the component. This additional space enables thorough cleaning with water or other alternate cleaning solutions rather than a CFC, and thereby eliminates the need for using CFCs to remove debris from underneath components on circuit boards.

DETAILED DESCRIPTION OF THE INVENTION

Figure 1:
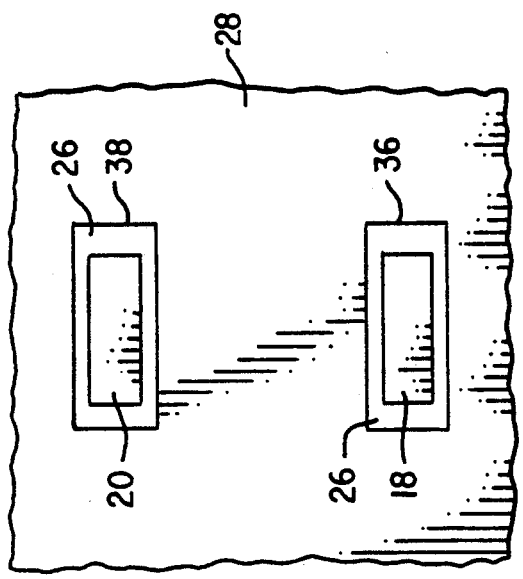
FIG. 1 illustrates how components were mounted to a circuit board in the past.
Figure 2:
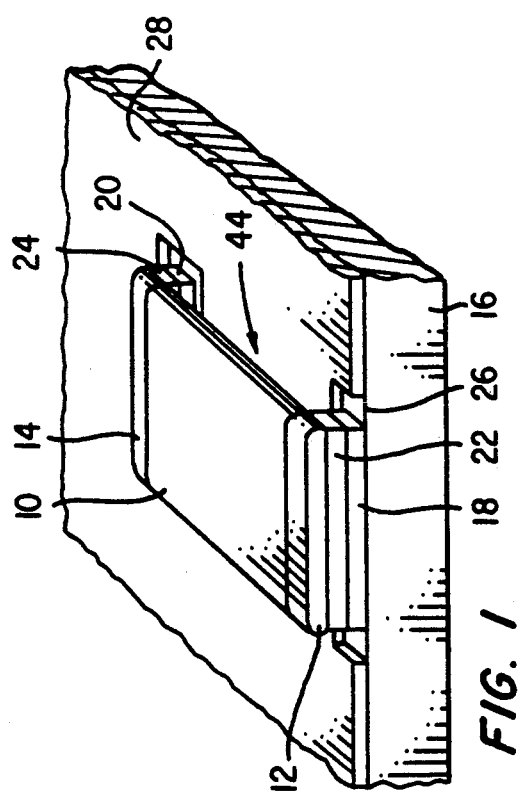
FIG. 2 illustrates a mask footprint for the arrangement of FIG. 1.
Figure 3:
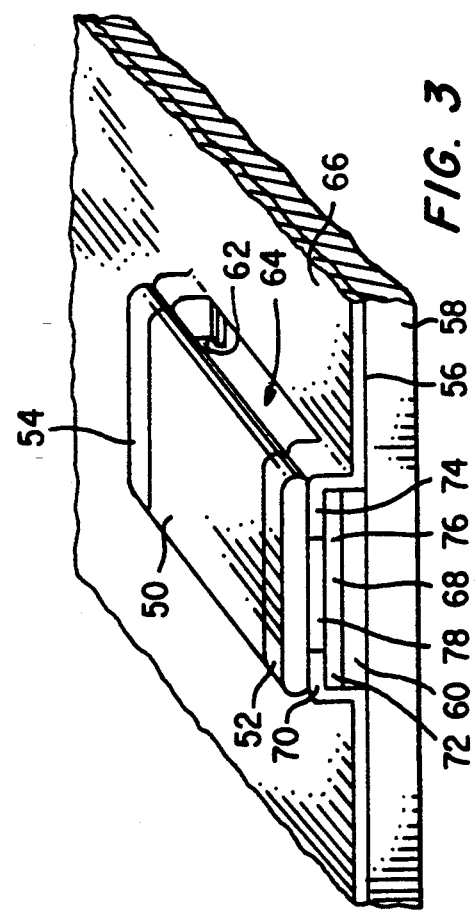
FIG. 3 illustrates a technique for mounting a component to a circuit board.

FIG. 3 illustrates component 50 with conductive contacts 52 and 54. Component 50 is mounted to top surface 56 of circuit board 58. Contact 52 is mounted to conductive pad 60 and contact 54 is mounted to conductive pad 62. Space 64, which is between component 50 and top surface 56, is increased by placing nonconductive mask 66 between conductive pad 60 and contact 52, and between conductive pad 62 and contact 54. Mask 66 is used to protect surface 56 of board 58 by covering most of surface 56. It is possible to further increase the size of space 64 by plating additional conductive material 68, such as copper, to the top surface of pads 60 and 62 before applying mask 66 to top surface 56 of circuit board 58. The amount of copper plated to pads 60 and 62 can be any convenient amount, however, in high speed circuits too much additional copper increases capacitance and thereby decreases the speed of the circuit. It is preferable that the total amount of copper for each pad, including the pad and plating, should be between approximately 0.5 oz. of copper per square inch and approximately 1.5 oz. of copper per square inch.

Mask 66 is positioned on surface 56 so that mask portion 70 covers end section 72 of plating 68, and so that mask portion 74 covers end section 76 of plating 68. If plating 68 is not used, mask portions 70 and 74 will cover the end sections of the pads.

After the mask is positioned, component 50 is soldered to circuit board 58 by solder 78. Solder 78 connects the contacts to plating 68, and if plating 68 is not used, solder 78 connects the contacts to their respective pads. To facilitate the connection, it is preferable to tin plate the surfaces that will be contacting the solder.

Space 64 is increased by adding plating 68 and end portions 70 and 74 on top of pads 60 and 62. Space 64 is further increased by not placing mask 66 directly beneath component 50. This additional space enhances the ability to use water rather than CFCs to remove debris from underneath component 50.

Figure 4:
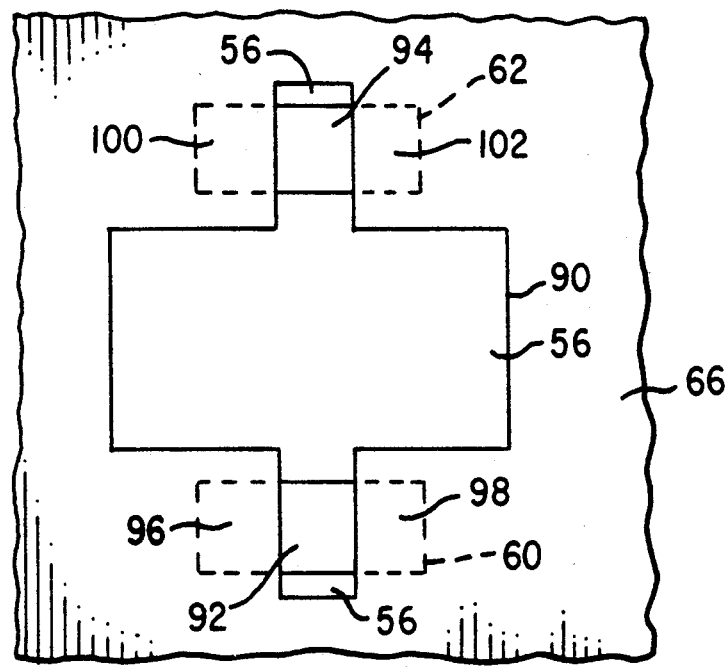
FIG. 4 illustrates a mask footprint for the arrangement of FIG. 3.

FIG. 4 illustrates a footprint for mask 66 that corresponds to FIG. 3. Outline 90 indicates the area that is not covered by mask 66. Sections 92 and 94 of pads 60 and 62, respectively, are not covered by mask 66. End sections 96 and 98 of pad 60 are covered by mask 66, and end sections 100 and 102 of pad 62 are covered by mask 66.

Figure 5:
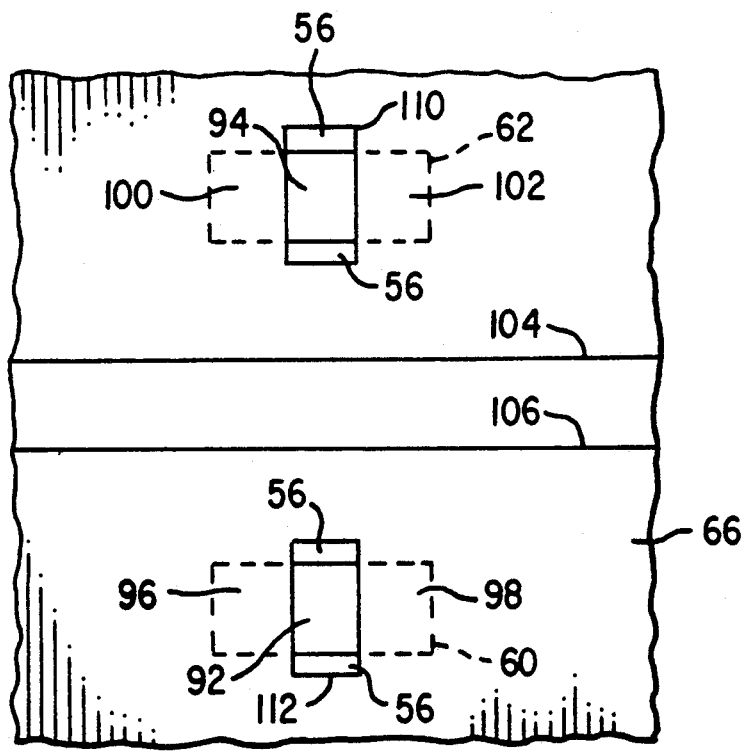
FIG. 5 illustrates a mask footprint when conductive paths are routed beneath the component.

FIG. 5 illustrates a footprint of mask 66 if conductive paths 104 and 106 are routed beneath component 50. Areas 110 and 112 indicate the portion of surface 56 which is not covered by mask 66. The center sections 92 and 94 of pads 60 and 62, respectively, are not covered by mask 66. Mask 66 covers end sections 96 and 98 of pad 60 and end sections 100 and 102 of pad 62.

Figure 6:
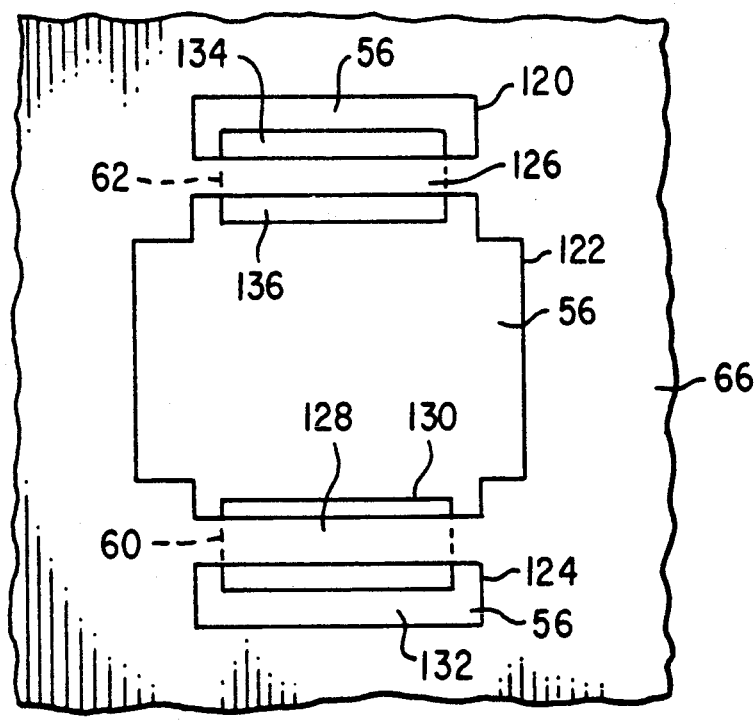
FIG. 6 illustrates an alternative mask footprint.

FIG. 6 illustrates an alternative footprint for mask 66. Areas 120, 122 and 124 indicate the areas of surface 56 which are not covered by mask 66. Mask 66 covers center section 126 of pad 62, and center section 128 of pad 60. Mask 66 does not cover end sections 130 and 132 of pad 60, and it does not cover end sections 134 and 136 of pad 62.

Figure 7:
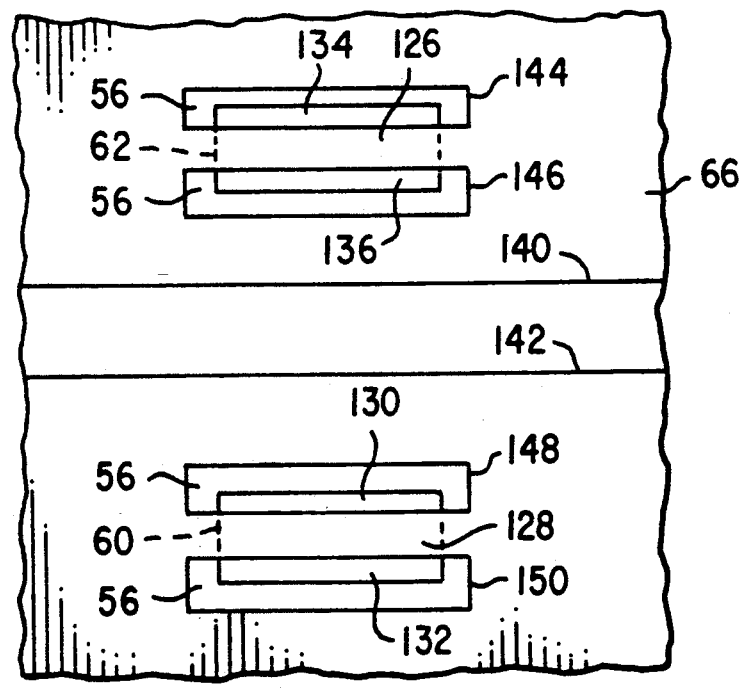
FIG. 7 illustrates an alternative mask footprint when conductive paths are routed beneath the component.

FIG. 7 illustrates an alternative footprint for mask 66 when conductive paths 140 and 142 are routed beneath component 50. Mask 66 covers conductive paths 140 and 142 to protect them. Areas 144, 146, 148 and 150 indicate the sections of surface 56 that are not covered by mask 66. Mask 66 covers center section 126 of pad 62, and center section 128 of pad 60. Mask 66 does not cover end sections 130 and 132 of pad 60, and end sections 134 and 136 of pad 62.

Figure 8:
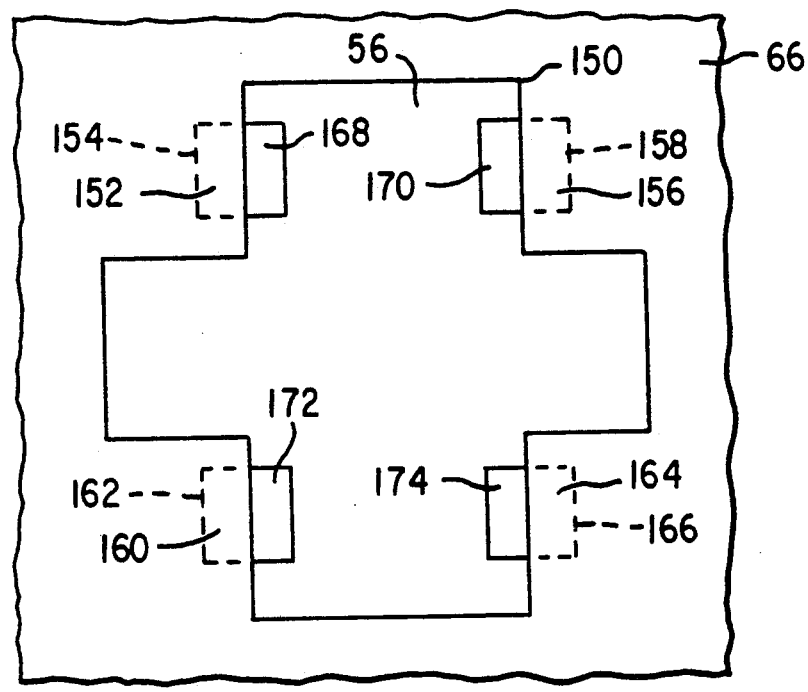
FIG. 8 illustrates a mask footprint for a split conductive pad configuration.

FIG. 8 illustrates a mask footprint for a split conductive pad configuration. In this configuration, the one large conductive pad used for each component conductive contact is replaced with two small conductive pads with a space in between them. Area 150 indicates the section of surface 56 that is not covered by mask 66. Mask 66 covers section 152 of pad 154, section 156 of pad 158, section 160 of pad 162 and section 164 of pad 166. Mask 66 does not cover section 168 of pad 154, section 170 of pad 158, section 172 of pad 162 and section 174 of pad 166.

As was discussed with regard to the large conductive pads, it is possible to increase the size of space 64 by plating additional conductive material, such as copper, to the top surface of the small conductive pads that compose the split pad configuration. The amount of copper can be any convenient amount, however, additional copper increases capacitance and thereby decreases the speed of a circuit. It is preferable that the total amount of copper for each small conductive pad, including the pad and plating, should be between approximately 0.5 oz. of copper per square inch and approximately 3 oz. of copper per square inch. It is more preferable to use approximately 1.5 oz. of copper per square inch.

Figure 9:
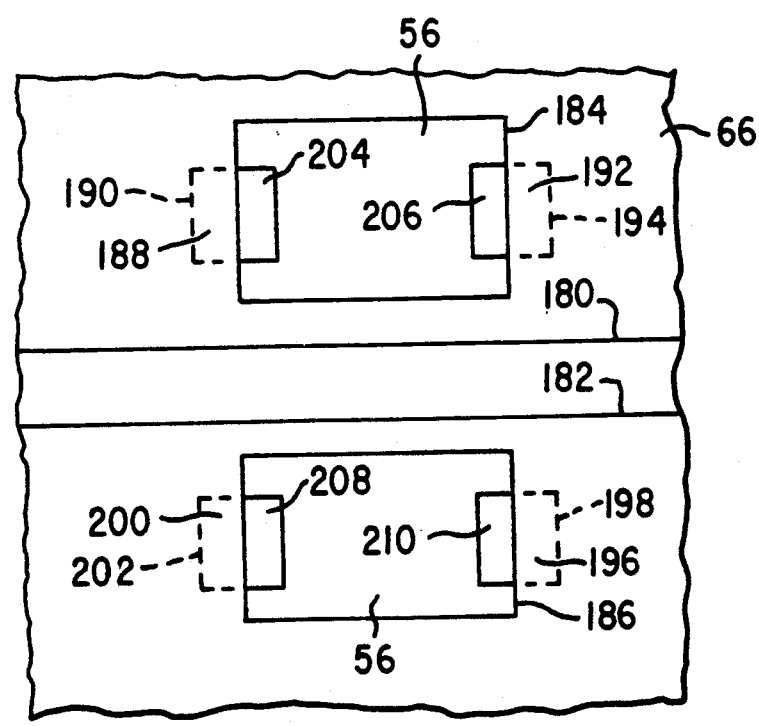
FIG. 9 illustrates a mask footprint for a split conductive pad configuration with conductive paths routed beneath the component.

FIG. 9 illustrates a mask footprint for a split conductive pad configuration with conductive paths 180 and 182 routed beneath component 50. Mask 66 covers conductive paths 180 and 182 to protect them. Areas 184 and 186 indicate the sections of surface 56 that are not covered by mask 66. Mask 66 covers section 188 of conductive pad 190, section 192 of conductive pad 194, section 196 of conductive pad 198 and section 200 of conductive pad 202. Mask 66 does not cover section 204 of pad 190, section 206 of pad 194, section 208 of pad 202 and section 210 of pad 198.

Any mask footprint that leaves a section of the pads uncovered may be used. A section of the pads should be left uncovered so that electrical contact can be established with the conductive contacts of device 50.

Mask 66 can be made of any nonconductive material that can be applied to surface 56 of circuit board 58. For example, mask 66 can be a typical epoxy based solder mask. The mask can have any convenient thickness, however, it is preferable to have a mask that is between approximately 0.001 inches and approximately 0.003 inches thick.

We claim:

1. A method for mounting components having a conductive contact to a circuit board having a conductive pad, said method comprising:
   (a) covering a section of the conductive pad with a nonconductive material; and
   (b) soldering the conductive contact to the conductive pad so that said nonconductive material is positioned between a section of the conductive contact and said section of the conductive pad.

2. The method of claim 1, wherein said step of covering said section of the conductive pad comprises covering said section of the conductive pad with an epoxy based nonconductive material.

3. The method of claim 1, wherein said step of covering said section of the conductive pad comprises covering said section of the conductive pad with a nonconductive material having a thickness between approximately 0.001 inches and approximately 0.003 inches.

4. The method of claim 1, wherein said step of covering said section of the conductive pad comprises covering a first and a second end section.

5. The method of claim 4, wherein said step of covering said section of the conductive pad comprises covering said section of the conductive pad with an epoxy based nonconductive material.

6. The method of claim 4, wherein said step of covering said section of the conductive pad comprises covering said section of the conductive pad with a nonconductive material having a thickness between approximately 0.001 inches and approximately 0.003 inches.

7. The method of claim 1, wherein said step of covering said section of the conductive pad comprises covering a center section.

8. The method of claim 7, wherein said step of covering said section of the conductive pad comprises covering said section of the conductive pad with an epoxy based nonconductive material.

9. A method for mounting components having a conductive contact to a circuit board having a conductive pad, said method comprising:
   (a) increasing the height of the conductive pad by plating the conductive pad with a layer of conductive material to form a plated conductive pad;
   (b) covering a section of said plated conductive pad with a nonconductive material; and
   (c) soldering the conductive contact to said plated conductive pad so that said nonconductive material is positioned between a section of the conductive contact and said section of said plated conductive pad.

10. The method of claim 9, wherein said step of covering said section of the conductive pad comprises covering said section of the conductive pad with an epoxy based nonconductive material.

11. The method of claim 9, wherein said step of covering said section of the conductive pad comprises covering said section of the conductive pad with a nonconductive material having a thickness between approximately 0.001 inches and approximately 0.003 inches.

12. The method of claim 9, wherein said step of covering said section of the conductive pad comprises covering a first and second end section.

13. The method of claim 12, wherein said step of covering said section of the conductive pad comprises covering said section of the conductive pad with an epoxy based nonconductive material.

14. The method of claim 12, wherein said step of covering said section of the conductive pad comprises covering said section of the conductive pad with a nonconductive material having a thickness between approximately 0.001 inches and approximately 0.003 inches.

15. The method of claim 9, wherein said step of covering said section of the conductive pad comprises covering a center section.

16. A method for mounting components having a conductive contact to a circuit board having a copper conductive pad, said method comprising:
 (a) increasing the height of the copper conductive pad by plating the copper conductive pad with a layer of copper to form a plated conductive pad having between approximately 0.5 oz/in$^2$ of copper and approximately 3 oz/in$^2$ of copper;
 (b) covering a first and second end section of said plated conductive pad with an epoxy based nonconductive material; and
 (c) soldering the conductive contact to said plated conductive pad so that said nonconductive material is positioned between a section of the conductive contact and said section of said plated conductive pad.

* * * * *